(12) United States Patent
Peng

(10) Patent No.: US 6,924,658 B2
(45) Date of Patent: Aug. 2, 2005

(54) DEVICE AND METHOD FOR CHECKING SIGNAL TRANSMISSION QUALITY OF CIRCUIT BOARD

(75) Inventor: Hsi-Chih Peng, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/750,333

(22) Filed: Dec. 31, 2003

(65) Prior Publication Data

US 2004/0171353 A1 Sep. 2, 2004

(30) Foreign Application Priority Data

Dec. 31, 2002 (TW) .................................... 91138133 A

(51) Int. Cl.[7] ........................................... G01R 31/26
(52) U.S. Cl. ....................................... 324/765; 324/763
(58) Field of Search ................................. 324/537–538, 324/73.1, 763, 765, 158.1; 714/25, 30, 43, 56; 257/48

(56) References Cited

U.S. PATENT DOCUMENTS

| | | | | | |
|---|---|---|---|---|---|
| 5,659,257 | A | * | 8/1997 | Lu et al. | 324/763 |
| 5,815,001 | A | * | 9/1998 | Michael | 324/763 |
| 5,818,251 | A | * | 10/1998 | Intrater | 324/765 |
| 6,124,715 | A | * | 9/2000 | Chakraborty | 324/537 |

\* cited by examiner

*Primary Examiner*—Minh N. Tang
(74) *Attorney, Agent, or Firm*—Madson & Metcalf

(57) ABSTRACT

A device and a method are used to check signal transmission quality of a circuit board. The circuit board communicates a source device with a destination device via a trace. The device for checking signal transmission quality is arranged in the source device, and includes a first comparator electrically connected to the trace, and generating a first counting signal in response to a first comparison result of a test signal transmitted through the trace with a first reference signal; a first counter electrically connected to the first comparator, and counting in response to the first counting signal to generate a first accumulatively counted value; and a discriminator determining the signal transmission quality of the circuit board according to accumulatively counted value.

23 Claims, 4 Drawing Sheets

DEVICE AND METHOD FOR CHECKING SIGNAL TRANSMISSION QUALITY OF CIRCUIT BOARD

FIELD OF THE INVENTION

The present invention relates to a device and a method for checking signal transmission quality, and more particularly to a device and a method for checking signal transmission quality of a circuit board.

BACKGROUND OF THE INVENTION

For any system comprising various circuits, the production cost can be reduced and the signal transmission reliability can be enhanced by incorporating these circuits into a single chip, which is so-called as a system on a chip (SOC). The SOC is becoming a mainstream for circuit design.

The SOC design, however, has not been perfectly developed yet. Therefore, for most systems, several circuit blocks or chips associated with different functions are still included in the system configuration, and a circuit board is required to serve as a platform for integrating the circuit blocks or chips. As such, the signal transmission on the circuit board is significantly affected by the properties of the circuit board, which includes the material of data transmission traces, the length of traces, the width of traces, the uniformity of traces, the signal interaction between traces and the linearity of traces, etc. In addition, the performance of the entire system also highly depends on the signal transmission quality of the circuit board.

Therefore, the waveforms of signals generated by the circuit blocks or chips and transmitted via the traces of the circuit board are checked to see if they appear as expected. The waveform information also serves as an index to determine whether the system design is successful.

Currently, the testing procedures of the system include the tests for individual circuit blocks or chips before they are assembled to a circuit board, and the tests for the assembled circuit board. A test signal outputted from a verified source chip to a verified destination chip via traces of the circuit board is checked manually by way of an external measuring tool to realize the data transmission quality. From the detected waveforms, the signal variation degree resulting from signal reflection and interference can be realized so as to determine the data transmission quality.

As is understood, the manual detection of the test signal wastes lots of time and labor. Moreover, if the quality requirement on the data transmission between circuit blocks or chips is very high, each of the circuit boards would need to be checked one by one to assure a high data transmission quality. Under this circumstance, the spent time and labor would be tremendous.

A conventional method for checking the data transmission quality of a circuit board incorporating therein separate chips will be illustrated hereinafter with reference to FIGS. 1 and 2A~2C. In FIG. 1, the circuit blocks and signals associated with the transmission quality test are shown. On the circuit board 10, a source chip 11 and a destination chip 12 are mounted. The source chip 11 outputs a test signal S1, which is transmitted to the destination chip 12 via a trace 13. The trace 13 is generally a metal conductive line made of copper foil.

In this prior art, the electric level of the test signal S1, after being transmitted to the destination chip 12, is likely to fluctuate during electric toggling due to signal reflection and interference. For example, superimposition of signals may occur. In addition, the trace 13 is considered as some kind of circuit impedance for signal transmission. If the circuit transmission impedance matching provided by the trace 13 is inferior, the waveform information detected by the external measuring tool will indicate significant electric level fluctuation of the test signal S1 during toggling.

FIGS. 2A~2C show the waveforms of the test signal S1 detected in various stages, wherein the electric level of the test signal S1 is considered high when it is higher than a first reference level Hi, and considered low when it is lower than a second reference level Lo.

Please refer to FIG. 2A which shows the test signal S1 generated by the source chip 11 and having not been transmitted via the trace 13 yet. At this stage, the waveform of the test signal S1 during the toggling period Tr1 is as shown. Further, after the test signal S1 is transmitted via the trace 13 to the destination chip 12 through signal reflection and interference, the ideal superimposed waveform of the test signal S1 during the toggling period Tr2 is as shown in FIG. 2B, on the condition that the trace 13 forms an ideal circuit impedance matching for the signal transmission of the test signal S1. On the other hand, if the trace 13 forms an inferior circuit impedance matching for the signal transmission of the test signal S, the waveform of the test signal S1 will be as shown in FIG. 2C. That is, during the toggling period Tr3, the electric level fluctuates dramatically. For example, during the toggling period Tr3, the electric level of the test signal S1 exceeds the high threshold around t2 and t4, and down to the low threshold around t1 and t3, which would confuse the test result.

SUMMARY OF THE INVENTION

Therefore, the present invention provides a device and a method for checking signal transmission quality of a circuit board while no external measuring tool is required.

The present invention also provides a device and a method for checking signal transmission quality of a circuit board, wherein the obtained transmission quality data can be referred to adjust the slew rate of the output signal.

A first aspect of the present invention relates to a method for checking signal transmission quality of a circuit board. The method comprises steps of: outputting a source signal from a first device to a second device via a trace on the circuit board; adopting the source signal transmitted through the trace as a test signal; comparing the test signal with a first reference signal at a plurality of time points to obtain a plurality of comparison results; and determining the signal transmission quality of the circuit board according to the plurality of comparison results.

For example, the first and the second devices are chips mounted on the circuit board and communicating with each other via the trace.

Preferably, the first reference signal has a first constant level, and levels of the test signal at the plurality of time points are compared with the first constant level to obtain the plurality of comparison results.

The signal transmission quality of the circuit board is determined according to a count of the plurality of comparison results complying with a predetermined result.

For example, the predetermined result is that a level of the test signal at a certain time point is higher than the first constant level. Preferably, the method further comprises a step of comparing the levels of the test signal at the plurality of time points with a second constant level lower than the first constant level. The signal transmission quality of the circuit board is determined according to a first count of the levels of the test signal higher than the first constant level and a second count of the levels of the test signal lower than the second constant level.

Preferably, the method further comprises a step of adjusting a slew rate of the test signal when the first and/or the second counts are within a predetermined range.

According to a second aspect of the present invention, the method for checking signal transmission quality of a circuit board comprises steps of: outputting a source signal from a first device to a second device via a trace on the circuit board; adopting the source signal transmitted through the trace as a test signal; comparing the test signal with a first reference signal at a plurality of time points, and accumulatively counting to obtain a first counted value whenever the comparison result complies with a first predetermined result; and determining the signal transmission quality of the circuit board according to the first counted value.

Preferably, the method further comprises a step of comparing the test signal with a second reference signal at the plurality of time points, and accumulatively counting to obtain a second counted value whenever the comparison result complies with a second predetermined result, and the signal transmission quality of the circuit board is determined according to the first and the second counted values. For example, the first predetermined result is that a level of the test signal at a certain time point is higher than the first constant level, and the second predetermined result is that a level of the test signal at a certain time point is lower than the second constant level.

A third aspect of the present invention relates to a device for checking signal transmission quality of a circuit board. The circuit board communicates a source device with a destination device via a trace. The device for checking signal transmission quality is arranged in the source device and comprises: a first comparator electrically connected to the trace, and generating a first counting signal in response to a first comparison result of a test signal transmitted through the trace with a first reference signal; a first counter electrically connected to the first comparator, and counting in response to the first counting signal to generate a first accumulatively counted value; and a discriminator determining the signal transmission quality of the circuit board according to accumulatively counted value.

Preferably, the source signal is adopted as the test signal after being outputted from an output buffer of the source device, transmitted via the trace and reflected by the destination device.

Preferably, the device further comprises a slew-rate adjusting element electrically connected to the test signal generator and the discriminator for adjusting a slew rate of the test signal according to the signal transmission quality of the circuit board.

Preferably, the slew-rate adjusting element is incorporated into the output buffer.

The source and the destination devices, for example, are chips.

Preferably, the device further comprises: a second comparator electrically connected to the trace, and generating a second counting signal in response to a second comparison result of the test signal with a second reference signal; and a second counter electrically connected to the second comparator, and counting in response to the second counting signal to generate a second accumulatively counted value for further reference of the discriminator to determine the signal transmission quality of the circuit board.

Preferably, the device further comprises: a first register electrically connected between the first counter and the discriminator for storing the first accumulatively counted value and then transmitted the first accumulatively counted value to the discriminator; and a second register electrically connected between the second counter and the discriminator for storing the second accumulatively counted value and then transmitted the second accumulatively counted value to the discriminator.

Preferably, the first and the second registers are disposed in a core logic unit of the source device.

Preferably, the discriminator is comprised by a core logic unit of the source device.

BRIEF DESCRIPTION OF THE DRAWINGS

The above contents and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In order to check the signal transmission quality of a circuit board, a test signal is transmitted from a source device to a destination device via a trace of the circuit board. Since the test signal will generally be reflected by the destination device so that the transmitted and reflected signals interfere with each other, the signal transmission quality can be realized by detecting the signal fluctuation of the test signal transmitted on the trace.

Figure 1:
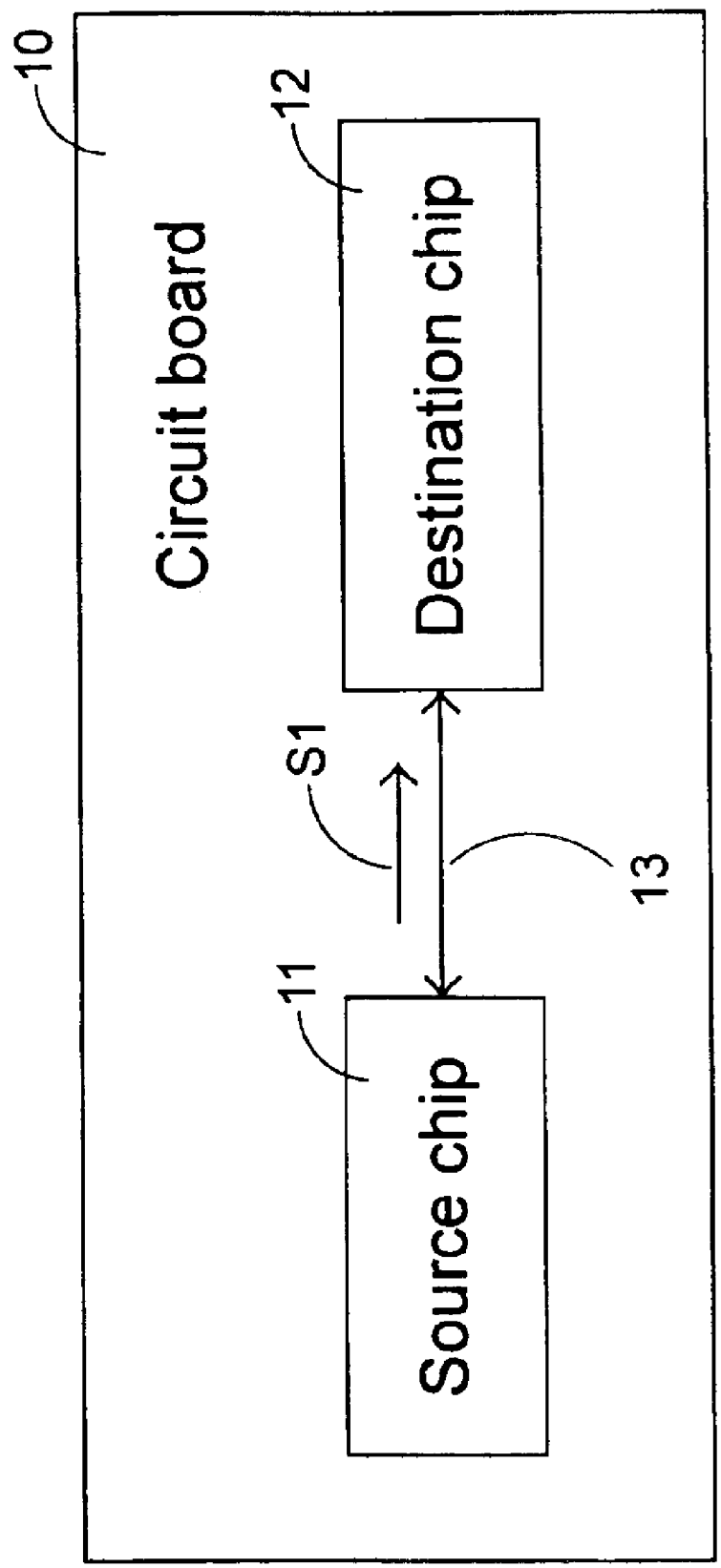
FIG. 1 is a block diagram illustrating the devices and signals associated with the transmission quality test.
Figure 2A:
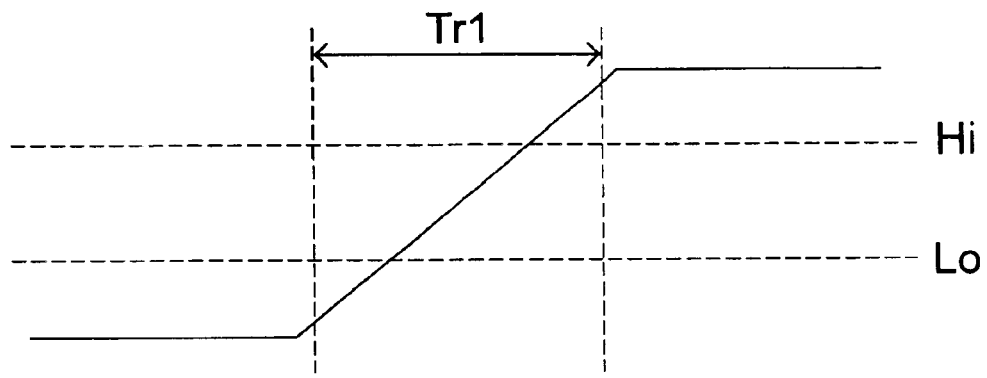
FIGS. 2A~2C are waveform diagrams of the test signal S1 detected in various stages.
Figure 2B:
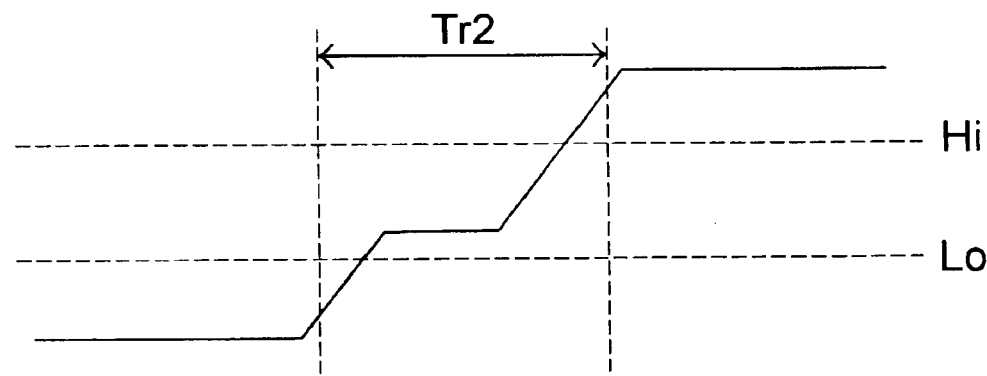
Figure 2C:
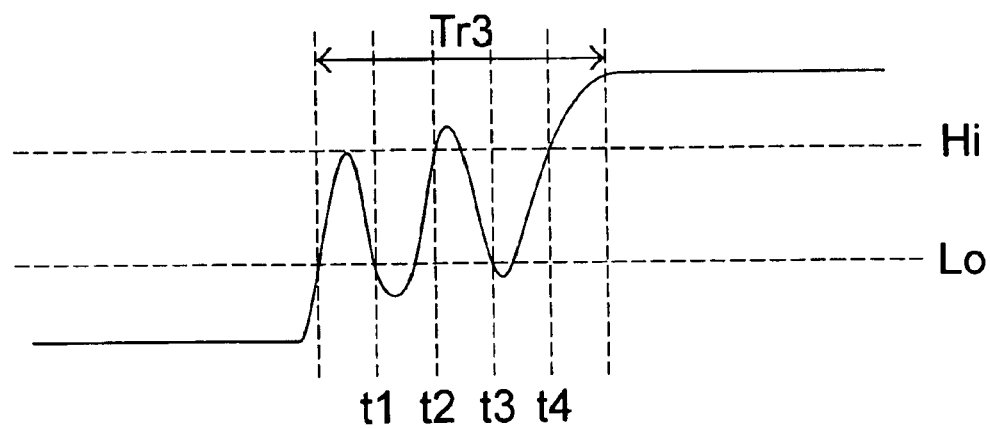
Figure 3:
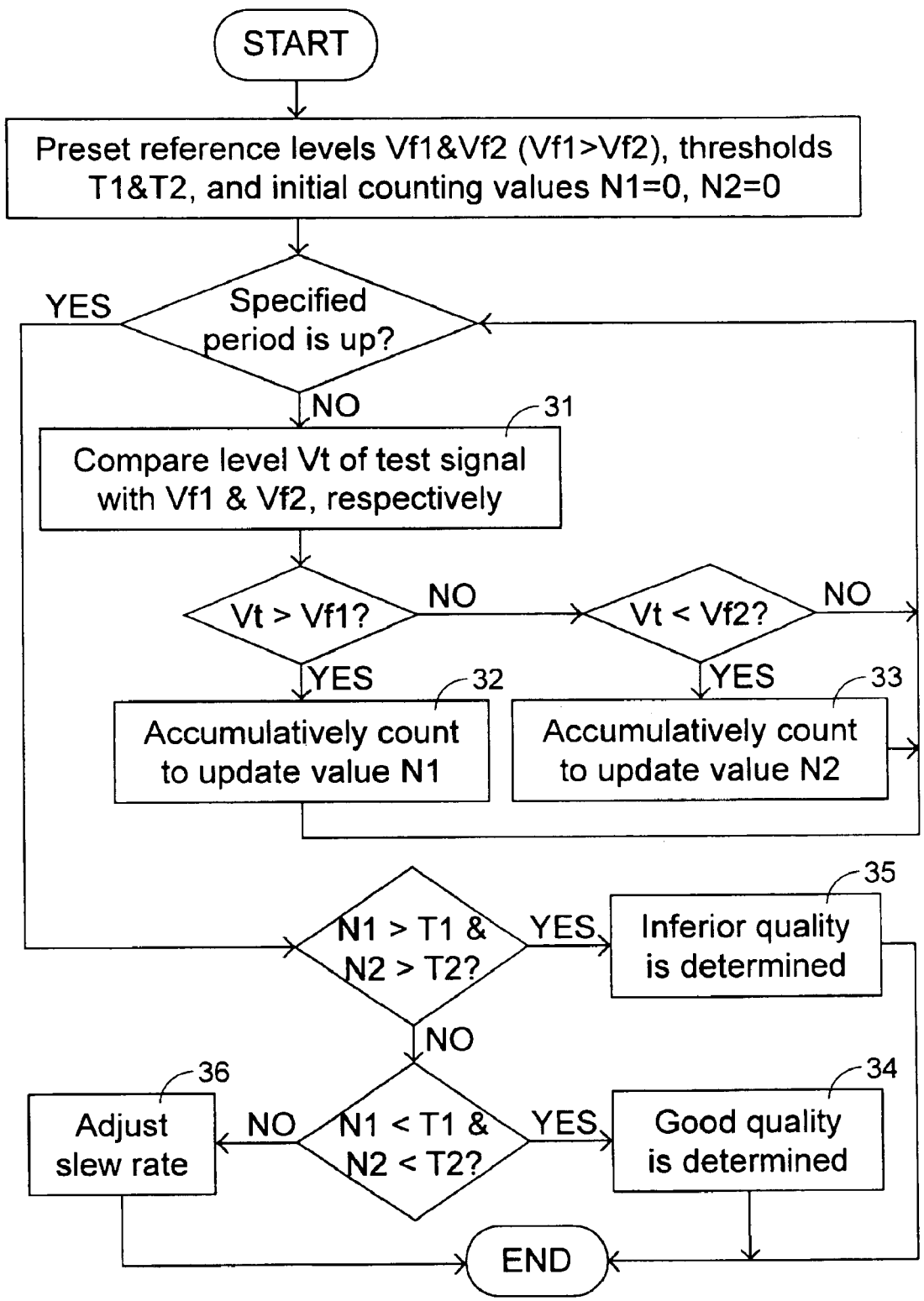
FIG. 3 is a flowchart illustrating a preferred embodiment of a method for checking signal transmission quality of a circuit board according to the present invention.

An embodiment for checking the signal transmission quality according to the test signal transmitted on the trace is shown in the flowchart of FIG. 3. The levels Vt of the test signal varying with time are sequentially compared with a comparatively high first reference value Vf1 and a comparatively low second reference level Vf2, respectively (Step 31). During the toggling period, the count of the occurrence that the level of the test signal is higher than the first reference level is accumulatively recorded as a first number N1 (Step 32). Likewise, the count of the occurrence that the level of the test signal is lower than the second reference level is accumulatively recorded as a second number N2 (Step 33). The first and the second numbers indicate how frequently the test signal fluctuates beyond the acceptable level range during the toggling period, and thus can be used to determine the signal transmission quality of the circuit board.

If the first number N1 and the second number N2 are both controlled within acceptable ranges, i.e. under the thresholds T1 and T2, respectively, the signal transmission quality of the circuit board will be determined to be good (Step 34). On the contrary, if the first number exceeds a first threshold and simultaneously the second number exceeds a second threshold, the signal transmission quality of the circuit board is apparently inferior because the signal fluctuates too much (Step 35). On the other hand, if only one of the first and second numbers exceeds its threshold, it is determined that the signal transmission quality of the circuit board is not as good as desired, but is still acceptable. Nevertheless, the slew rate of the subsequent signals outputted by the source device is preferably adjusted to comply with the condition of the circuit board so as to improve the signal transmission quality of the circuit board (Step 36).

Figure 4:
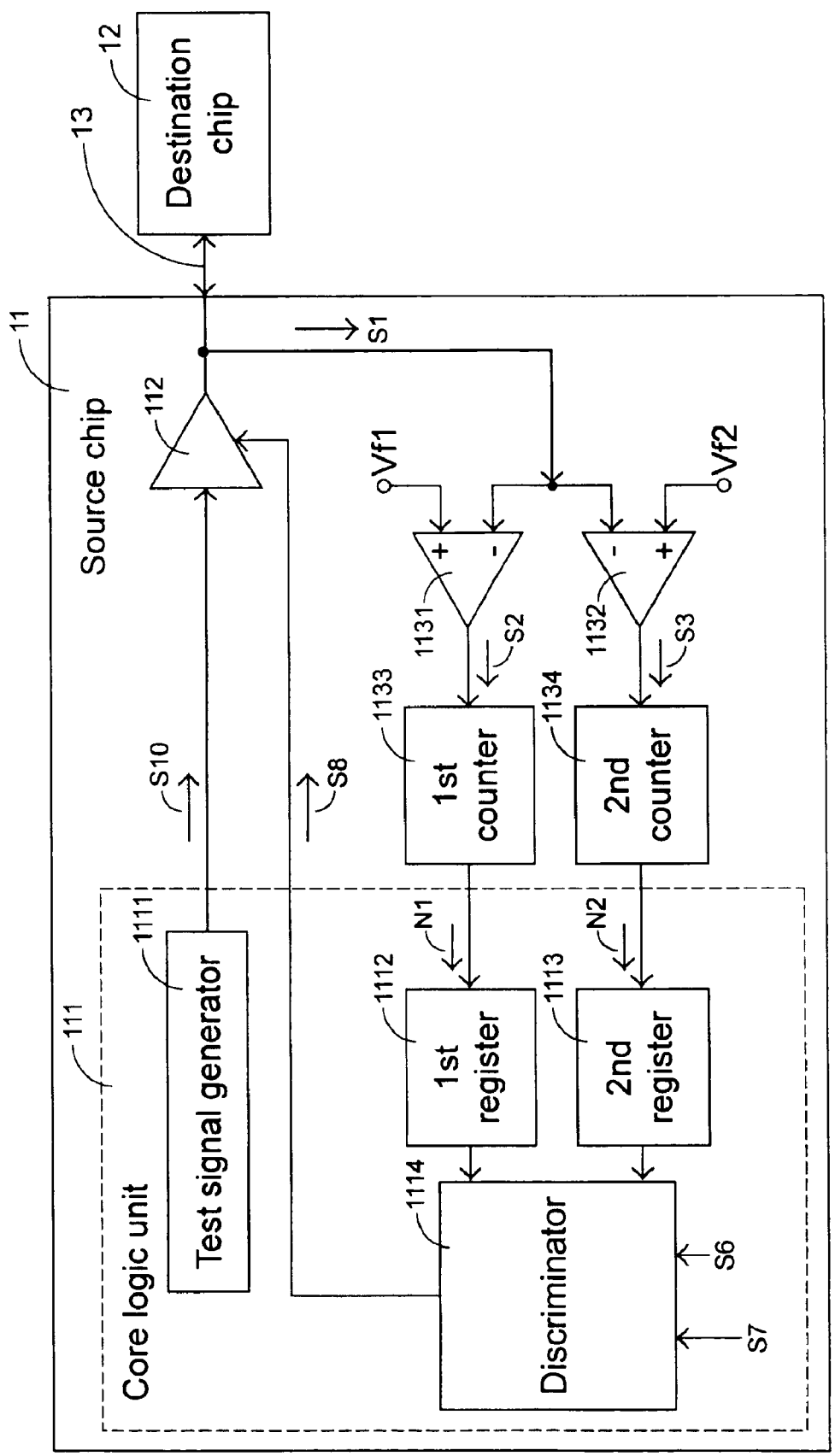
FIG. 4 is a functional block diagram schematically showing a preferred embodiment of a device for checking signal transmission quality of a circuit board according to the present invention.

The above method for checking signal transmission quality of a circuit board can be implemented by a device shown in FIG. 4. The device checking signal transmission quality of a circuit board comprises a test signal generator 1111, a first register 1112, a second register 1113, a discriminator 1114, a first comparator 1131, a second comparator 1132, a first counter 1133 and a second counter 1134. The test signal generator 1111, first register 1112, second register 1113 and discriminator 1114 are incorporated into a core logic unit 111 of the source chip 11. The first comparator 1131, second comparator 1132, first counter 1133 and second counter 1134 are arranged in the source chip 11, and electrically connected between the core logic unit 111 and an output buffer 112 of the source device 11 as shown. First of all, a source signal S10 is generated by the test signal generator 1111, which is then transmitted out from the output buffer and forwarded to the destination chip 12 via the trace 13. Generally, the source signal S10 will suffer from signal reflection and interference during the transmission between the chips via the trace.

The source signal S10 transmitted from the output buffer 112 to the trace 13 is adopted as a test signal S1. The test signal S1 is then transmitted to the comparators 1131 and 1132 to have the level Vt thereof compared with a high reference level Vf1 and a low reference level Vf2, respectively. Whenever the level Vt becomes greater than the high reference level Vf1 during the toggling period, a counting value S2 is asserted to have the first counter 1133 generate an accumulatively counted value N1. Likewise, whenever the level Vt becomes smaller than the low reference level Vf2 during the toggling period, a counting value S3 is asserted to have the second counter 1134 generate an accumulatively counted value N2. The first and the second counting values N1 and N2 are stored in the first and the second registers 1112 and 1113, respectively. According to the accumulatively counted values N1 and N2 and two preset thresholds T1 and T2, the discriminator 114 determines the signal transmission quality of the circuit board.

For example, the threshold T1 for the counting value N1 is set to be 1, and the threshold T2 for the counting value N2 is set to be 0. If the counting value N1 exceeds the threshold T1, and at the same time, the counting value N2 exceeds the threshold T2, the discriminator 114 will determine that the signal transmission quality of the circuit board is not good. On the other hand, if both the counting values N1 and N2 are no greater than respective thresholds T1 and T2, the signal transmission quality of the circuit board will be determined to be good. As for the condition that only one of the counting values N1 and N2 exceeds its threshold T1/T2, it means that the signal transmission quality of the circuit board is not as good as desired, but is still acceptable. Under this circumstance, the discriminator preferably asserts a slew-rate adjusting signal S8 to adjust the slew rate of the test signal S1 outputted from the output buffer 112. The output buffer 112 is a slew-rate adjustable output buffer serving as both slew-rate adjusting element and output buffer to achieve this purpose. Alternatively, the slew-rate adjusting procedure can also be performed when both the counting values N1 and N2 exceed respective thresholds. The slew-rate adjustment can be performed by conventional way. For example, the two-bit slew-rate adjusting signal S8, i.e. "00", "01", "10" and "11", is used to impart four kinds of slew rates to the test signal S1.

It is understood from the above description that the signal transmission quality of a circuit board can be self-realized without the usage of any external tool(s) or any manual detection. Moreover, the information of the signal transmission quality can be referred to optionally adjust the slew rate of signals, thereby enhancing the satisfactory yield of the products.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for checking signal transmission quality of a circuit board, comprising steps of:
    outputting a source signal from a first device to a second device via a trace on said circuit board;
    adopting said source signal transmitted through said trace as a test signal;
    comparing said test signal with a first reference signal at a plurality of time points to obtain a plurality of comparison results; and
    determining the signal transmission quality of said circuit board according to said plurality of comparison results.

2. The method according to claim 1 wherein said first and said second devices are chips mounted on said circuit board and communicating with each other via said trace.

3. The method according to claim 1 wherein said first reference signal has a first constant level, and levels of said test signal at said plurality of time points are compared with said first constant level to obtain said plurality of comparison results.

4. The method according to claim 3 wherein the signal transmission quality of said circuit board is determined according to a count of said plurality of comparison results complying with a predetermined result.

5. The method according to claim 4 wherein said predetermined result is that a level of said test signal at a certain time point during a toggling period is higher than said first constant level.

6. The method according to claim 5 further comprising a step of comparing said levels of said test signal at said plurality of time points during a toggling period with a second constant level lower than said first constant level.

7. The method according to claim 6 wherein the signal transmission quality of said circuit board is determined according to a first count of said levels of said test signal higher than said first constant level and a second count of said levels of said test signal lower than said second constant level.

8. The method according to claim 7 further comprising a step of adjusting a slew rate of said test signal when said first and/or said second counts are within a predetermined range.

9. The method according to claim 4 wherein said predetermined result is that a level of said test signal at a certain time point during a toggling period is lower than said first constant level.

10. A method for checking signal transmission quality of a circuit board, comprising steps of:
   outputting a source signal from a first device to a second device via a trace on said circuit board;
   adopting said source signal transmitted through said trace as a test signal;
   comparing said test signal with a first reference signal at a plurality of time points, and accumulatively counting to obtain a first counted value whenever the comparison result complies with a first predetermined result; and
   determining the signal transmission quality of said circuit board according to said first counted value.

11. The method according to claim 10 further comprising a step of comparing said test signal with a second reference signal at said plurality of time points, and accumulatively counting to obtain a second counted value whenever the comparison result complies with a second predetermined result, and the signal transmission quality of said circuit board is determined according to said first and said second counted values.

12. The method according to claim 11 wherein said first predetermined result is that a level of said test signal at a certain time point during a toggling period is higher than a first constant level of said first reference signal, and said second predetermined result is that a level of said test signal at a certain time point during a toggling period is lower than a second constant level of said second reference signal.

13. The method according to claim 11 further comprising a step of adjusting a slew rate of said test signal when said first and/or said second counted values are within a predetermined range.

14. A device for checking signal transmission quality of a circuit board, said circuit board communicating a source device and a destination device via a trace, and said device for checking signal transmission quality being arranged in said source device and comprising:
   a first comparator electrically connected to said trace, and generating a first counting signal in response to a first comparison result of a test signal transmitted through said trace with a first reference signal;
   a first counter electrically connected to said first comparator, and counting in response to said first counting signal to generate a first accumulatively counted value; and
   a discriminator determining the signal transmission quality of said circuit board according to said first accumulatively counted value.

15. The device according to claim 14 further comprising a test signal generator for generating a source signal with toggling action, wherein said source signal is adopted as said test signal after being outputted from an output buffer of said source device, transmitted via said trace and reflected by said destination device.

16. The device according to claim 15 further comprising a slew-rate adjusting element electrically connected to said test signal generator and said discriminator for adjusting a slew rate of said test signal according to the signal transmission quality of said circuit board.

17. The device according to claim 16 wherein said slew-rate adjusting element is incorporated into said output buffer.

18. The device according to claim 14 wherein said source and said destination devices are chips.

19. The device according to claim 14 further comprising:
   a second comparator electrically connected to said trace, and generating a second counting signal in response to a second comparison result of said test signal with a second reference signal; and
   a second counter electrically connected to said second comparator, and counting in response to said second counting signal to generate a second accumulatively counted value for further reference of said discriminator to determine the signal transmission quality of said circuit board.

20. The device according to claim 19 wherein said first comparison result indicates that a level of said test signal is higher than a level of said first reference signal, and said second comparison result indicates that a level of said test signal is lower than a level of said second reference signal.

21. The device according to claim 19 further comprising:
   a first register electrically connected between said first counter and said discriminator for storing said first accumulatively counted value and then transmitted said first accumulatively counted value to said discriminator; and
   a second register electrically connected between said second counter and said discriminator for storing said second accumulatively counted value and then transmitted said second accumulatively counted value to said discriminator.

22. The device according to claim 21 wherein said first and said second registers are disposed in a core logic unit of said source device.

23. The device according to claim 14 wherein said discriminator is comprised by a core logic unit of said source device.

* * * * *